(12) United States Patent
Finkenzeller

(10) Patent No.: US 8,130,080 B2
(45) Date of Patent: Mar. 6, 2012

(54) TRANSPONDER ACTUATABLE SWITCHING DEVICE

(75) Inventor: Klaus Finkenzeller, Unterföhring (DE)

(73) Assignee: Giesecke & Devrient GmbH, Munich (DE)

( * ) Notice: Subject to any disclaimer, the term of this patent is extended or adjusted under 35 U.S.C. 154(b) by 890 days.

(21) Appl. No.: 11/991,641

(22) PCT Filed: Sep. 14, 2006

(86) PCT No.: PCT/EP2006/008971
§ 371 (c)(1),
(2), (4) Date: May 28, 2008

(87) PCT Pub. No.: WO2007/031318
PCT Pub. Date: Mar. 22, 2007

(65) Prior Publication Data
US 2009/0096587 A1    Apr. 16, 2009

(30) Foreign Application Priority Data
Sep. 16, 2005  (DE) .......................... 10 2005 044 438

(51) Int. Cl.
*H04Q 5/22*    (2006.01)
*G08C 19/16*   (2006.01)
*G08B 23/00*   (2006.01)
*G01R 31/08*   (2006.01)
*H01H 35/00*   (2006.01)

(52) U.S. Cl. ................. 340/10.34; 340/10.1; 340/12.38; 340/10.33; 340/693.3; 324/525; 307/116

(58) Field of Classification Search ...... 340/10.1–10.52, 340/693.3; 307/112–143; 324/525
See application file for complete search history.

(56) References Cited

U.S. PATENT DOCUMENTS
4,546,241 A    10/1985    Walton
(Continued)

FOREIGN PATENT DOCUMENTS
| EP | 1 538 558 A2 | 6/2005 |
| WO | WO 03/069538 A1 | 8/2003 |
| WO | WO 2005/013506 | 2/2005 |

* cited by examiner

FOREIGN PATENT DOCUMENTS
*Primary Examiner* — Benjamin C Lee
*Assistant Examiner* — Omeed Alizada
(74) *Attorney, Agent, or Firm* — Bacon & Thomas, PLLC

(57) ABSTRACT

The present invention relates to a switching device for generating a switch signal, a reading device with the switching device and a method for the communication between a reading device and a transponder (T). The switching device includes an antenna (4), which with the help of an adapter circuit (AN) is adapted to a given resistance, and a measuring bridge (1), which includes two voltage dividers connected in parallel. The resistance acts in one of the voltage dividers and in the case of a change of the resistance the measuring bridge (1) generates the switch signal. This means when a transponder reaches the detection range of a reading device having the switching device, an additional impedance is coupled in, which acts on the measuring bridge (1). This change is recognized and leads to the generation of the switch signal.

17 Claims, 2 Drawing Sheets

TRANSPONDER ACTUATABLE SWITCHING DEVICE

BACKGROUND OF THE INVENTION

A. Field

The present invention relates to a switching device for generating a switch signal, which is equally suitable for the integration into a transponder reading device and for subsequently equipping a transponder reading device. Furthermore, the invention relates to a reading device having such a switching device and a method for the communication between a reading device and a transponder.

B. Related Art

In standards ISO/IEC 14443 and ISO/IEC 15693 a method is described, how a transponder reading device can set up a data connection with a transponder of another device (contactless chip card/RFID transponder). For this purpose the reading device periodically emits a search signal with a high field strength (e.g. 1.5-7.5 A/m according to ISO/IEC 14443) until a device provided with transponder reaches the response range of the reading device, is provided with energy from the field of the reading device and sends a response to the reading device. For reading devices with limited energy resources, however, this results in a reduction of the possible operating lifetime, in particular for battery powered devices.

In order to increase the operating lifetime of a reading device, U.S. Pat. No. 6,150,948 describes an RFID reading device, which with the help of an energy-saving detector searches for transponders in the surrounding. For example, this detector is a detector operating on an infrared basis. The RFID reading device itself is not activated until a transponder is detected in the proximity of the reading device.

From WO 03/069538 A1 is known a switching device for a reading device to be activated with the help of a transponder, which as long as a switching operation is not triggered can be operated in a nearly loadless fashion. For this purpose the reading device to be activated is provided with a coil, which is part of an oscillating circuit, which in the recognition mode is operated as a substantially unloaded pure oscillating circuit. The resonant frequency in the oscillating circuit is monitored by a frequency observer. If a transponder with a transponder coil approaches the recognition coil, the resonant frequency of the oscillating circuit changes. This is detected by the frequency observer, which thereupon generates a switch signal that switches on the reading device to be activated. With that it is possible to recognize a transponder in the proximity of the coil even without a transmitting power (worth mentioning), since the field strength of the search signal emitted during the—optionally periodical—measuring operation no longer is used for supplying a transponder with energy.

WO 2005/013506 A1, too, describes a measuring and switching device for measuring the influence an approaching transponder has on a transmitting antenna of an RFID reading device. WO 2005/013506 A1 in particular describes in detail the processes in a reading device for detecting a transponder without the emission of energy for supplying this transponder with energy. A substantial part of WO 2005/013506 A1 is a measuring device for measuring the electrical properties of the transmitting antenna of the reading device, the circuit of the measuring device for example being formed as a PLL circuit. PLL stands for "phase locked loop" and means, that a signal with a frequency is set so exactly relative to a signal with a reference frequency that the phase relation between the signals is permanently set. A disadvantage of the described PLL circuit is, however, that it uses the antenna coil of the reading device antenna as a frequency-determining component of an oscillator. This means that the PLL circuit must be directly connected with the antenna coil. But with many reading devices the reader antenna is adapted with an adapter circuit to an impedance of 50Ω and is installed via a coaxial cable connection, detached from the electronics of the reading device. With such an arrangement the described PLL circuit can be realized only with difficulties or cannot be realized at all.

Therefore, it is the problem of the present invention to specify a switching device for a transponder reading device to be activated to be actuated by a transponder which on the side of the reading device to be activated has a power consumption as low as possible and, furthermore, in terms of circuitry is especially easy to realize.

This problem is solved by a switching device, a reading device provided therewith and a method according to the independent claims. In claims dependent thereon advantageous embodiments and developments of the invention are specified.

BRIEF SUMMARY OF THE INVENTION

The switching device according to the invention substantially comprises an antenna and a measuring bridge, which consists of two voltage dividers connected in parallel. The antenna is adapted to a given resistance with the help of an adapter circuit and the resistance acts in one of the voltage dividers. When the resistance changes, a switch signal is generated. When the switching device according to the invention for example is used in a reading device for the communication with a transponder, the resistance of the adapter circuit changes as soon as a transponder reaches the detection range of the reading device. When the antenna for example is an antenna coil, which produces an electromagnetic alternating field, by a magnetic reverse coupling between the antenna coil of the reading device and the antenna coil of the transponder an additional impedance is transformed in the antenna coil. With that the resistance adapted with the help of the adapter circuit, which acts on one of the voltage dividers, also changes. This change is recognized by the measuring bridge and leads to a control signal, which for example activates the reading device to communicate with the transponder. Then the communication between the reading device and the transponder is effected in a known fashion.

Preferably, each voltage divider of the measuring bridge comprises two resistors connected in series, then the measuring bridge especially preferred being realized as a Wheatstone bridge circuit.

The circuit required for recognizing a transponder in the recognition range of a reading device can be operated in a nearly loadless fashion, because the switching device according to the invention does not need to emit periodical request signals of a high field strength in order to recognize a transponder. Accordingly, the switching device has an extraordinarily low power consumption. For this reason it is especially suitable for actuating circuits the power supply of which is effected with the help of a limited power source. Therefore, in particular it is suitable for supplying circuits powered by small batteries, solar cells, fuel cells and similar energy sources. Since the device is largely independent of the size of the provided power source, a flexible use in a wide variety of places of incorporation is possible for which the device otherwise would not be suitable.

Furthermore, the reading device according to the invention is very user-friendly, because it does not require any special handling measures from a user. The employed transponders can have the usual form of appearance and can be used in the usual way. In particular, any particular constructive measures with respect to the structure of the transponder are not required. Therefore, a special advantage of the reading device according to the invention is that on the part of the transponder the already present coil of the transponder triggers the switching operation, thus any particular components are not required. Accordingly, the transponders can have a cost-effective form.

A further advantage of the invention is, that the adapter circuit can be designed to adapt the antenna to a resistance of e.g. 50Ω, i.e. to the impedance of 50Ω typical for transponder-reading devices. Therefore, the measuring bridge can be disposed via a coaxial circuit connection separated from the antenna coil or reading device. Furthermore, subsequently realizing the switching device according to the invention in already existing reading devices is possible without problems.

DESCRIPTION OF THE DRAWINGS

Further features and advantages of the invention appear from the following description of various embodiments and alternative embodiments according to the invention in connection with the accompanying Figures.

DETAILED DESCRIPTION OF THE PREFERRED EMBODIMENTS OF THE INVENTION

Figure 1:
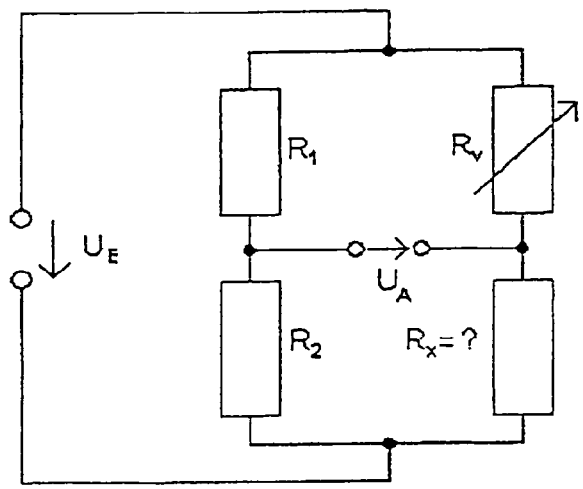
FIG. 1 shows the schematic circuit diagram of the Wheatstone measuring bridge known from prior art.

FIG. 1 shows the Wheatstone measuring bridge known from prior art. A Wheatstone measuring bridge is a parallel circuit of two voltage dividers, its structure is known. The measuring bridge is balanced, when in the bridge diagonal does not flow any a current—in the case of a realization with four resistors this means when the resistance ratio in the two voltage dividers is equal. With the help of a balanced measuring bridge an unknown resistance can be determined. For this purpose a voltage divider has to be replaced by a potentiometer and the following balance condition has to be used:

$$R1/R2=Rv/Rx \text{ or } U1/U2=Uv/Ux.$$

Input voltage UE and output voltage UA each are applied or tapped at opposing connection points. Resistances R1 and R2 are known, and Rv is a variable known comparator resistance. Rx is the unknown resistance to be determined. Now, Rv is set or selected such that via the bridge a current does not flow—i.e. at UA a voltage is not tapped; this operation is also referred to as null balancing. The Wheatstone measuring bridge is mainly used in measuring technology and automatic control engineering (sensor engineering) for precision measurings. In alternating current technology there are often used impedances instead of pure resistances, in order to balance effective resistance and reactance at the same time. Depending on the number of variable resistances one differentiates between quarter bridge (one variable impedance), half bridge (two variable impedances) and full bridge (four variable impedances).

Figure 2:
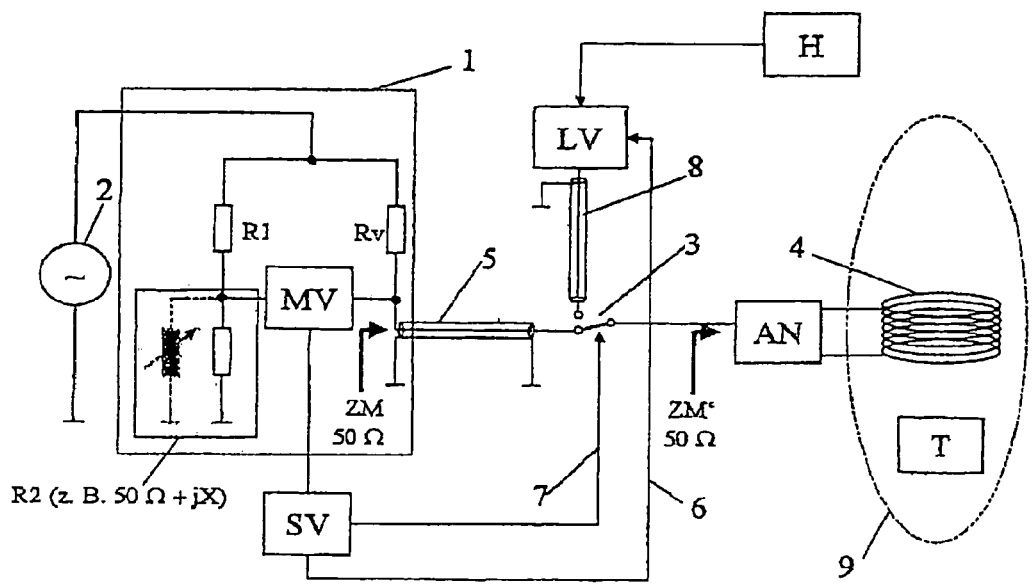
FIG. 2 shows the basic structure of a switching device according to the invention.

FIG. 2 shows an embodiment of an evaluation device according to the invention. The evaluation device consists of a Wheatstone measuring bridge 1, a high-frequency oscillator 2, a measuring amplifier MV, a control device SV, an antenna adapter circuit AN for a reading antenna 4, and an RFID reading apparatus LV. Furthermore, the reading apparatus LV can be connected with a host computer H.

High-frequency oscillator 2 generates a sinusoidal alternating voltage with a frequency corresponding to the transmitting frequency of the reading apparatus LV, e.g. 13.56 megahertz, which is fed into the measuring bridge 1. Measuring bridge 1 consists of the two voltage dividers R1/R2 and Rv/ZM.

The reading antenna 4 usually consists of a conductor loop with at least one turn. With the help of the adapter circuit AN the conductor loop is resonated at the transmitting frequency of the reading device (oscillating circuit) and at the same time the impedance of the antenna is transformed to a real resistance of 50Ω at the input of the adapter circuit. The input of the adapter circuit AN is connected via a switch 3, and optionally a coaxial connection 5, to the measuring bridge 1. In measuring bridge 1 the driving-point impedance ZM visible at the coaxial connection, normally the driving-point impedance of the adapter circuit AN (i.e. 50Ω), is effective component of the voltage divider Rv/ZM. In the case of an appropriate spatial proximity between switch 3 and measuring bridge 1 the coaxial cable connection 5, optionally, can be left out. In this case, too, the impedance ZM corresponds to the driving-point impedance of the adapter circuit AN.

The bridge is balanced such that the condition R1/R2=Rv/ZM is met, i.e. there normally applies: R1/R2=Rv/50Ω. In this case the voltage UA between the two voltage dividers becomes zero.

If a transponder T reaches the response range 9 of the antenna 4, by a magnetic reverse coupling between antenna coil 4 and the antenna coil of the transponder T an additional impedance is transformed in antenna coil 4. This leads to the fact that impedance ZM' at the output of adapter circuit AN also changes, i.e. no longer corresponds to real 50Ω, but can take any value R±jX. At the end of coaxial cable 5 the changed value of the impedance ZM can be measured, too. This leads to the fact that the condition R1/R2=Rv/ZM no longer is met and voltage UA between the two voltage dividers becomes unequal zero. With the help of measuring amplifier MV this voltage is increased and supplied to control device SV in the form of a control signal. When a defined threshold is exceeded, i.e. when a control signal is sent by measuring bridge 1 to control device SV, control device SV assumes that now a transponder is in the response range 9 of the antenna coil 4.

For initiating a communication with transponder T then in a first step the adapter circuit AN is connected via switch 3 with reading apparatus LV. For this purpose switch 3 is actuated with a switch signal 7 by control device SV. In a second step control device SV sends a start signal to reading apparatus LV, whereupon the reading device switches on the transmitter and sets up a communication connection with the transponder.

When transponder T leaves the response range of antenna 4, there can be provided that the reading apparatus LV signals to the control device SV, that a transponder cannot be addressed any longer. Then control device SV again switches adapter circuit AN via switch 3 to measuring bridge 1, which then again is in a balanced state, i.e. the condition R1/R2=Rv/50Ω again is met. At the same time the transmitter of reading apparatus LV is switched off in order to not unnecessarily consume energy.

In practice adapter circuit AN cannot always adapt antenna 4 to have exactly real 50Ω by. There often remains a low complex resistance jX. But by adding a complex resistance $jX_2$ at least one of the resistances R1, R2 or Rv the balanced state can be restored. In FIG. 2 by way of example is shown, that the resistance R2 is dimensioned as: R2=50Ω±jX.

It is obvious that the principle of function of the arrangement according to the invention can also be employed with antenna input resistances others than 50Ω. Then the measuring bridge has to be dimensioned in an adapted fashion, so that the balance condition R1/R2=Rv/ZM is met.

For the easier integration into a transponder reading device or for subsequently equipping a transponder reading device with the arrangement according to the invention, measuring bridge 1, high-frequency oscillator 2 and control device SV are expediently accommodated in an integrated detection unit. Such a detection unit has an input for a voltage supply, which also supplies reading apparatus LV. It further has a high-frequency alternating voltage output for the connection to switch 3 or reading antenna 4, a switching output connected with reading apparatus LV and switch 3 for switching on and off the two, as well as a reset input for receiving a reset signal from reading apparatus LV after a transponder has been removed from response range 9.

Figure 3:
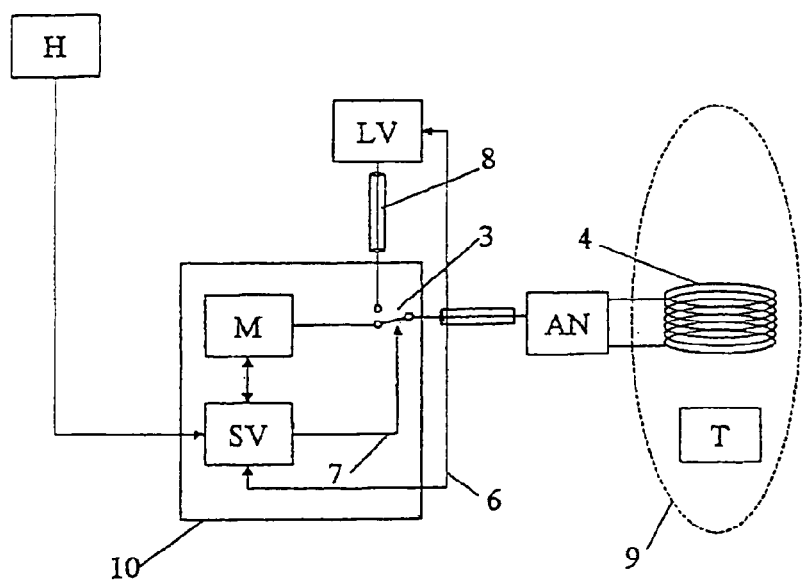
FIG. 3 shows the structure of an apparatus for subsequently equipping a reading device with the switching device according to the invention.

FIG. 3 shows an apparatus 10 for subsequently equipping a reading device with the loadless transponder recognition circuit according to the invention. In the embodiment shown in FIG. 3 control device SV is provided with software means for the communication with a host H as well as for activating the reading device to be subsequently equipped. Furthermore, the direct communication between reading apparatus LV and host H is interrupted and instead is led and controlled via control device SV. In antenna connection 8 between reading apparatus LV and adapter circuit AN, moreover, the switch 3 of the apparatus 10 is inserted.

It is provided, that host H at first communicates with control device V. As long as the measuring device M according to the invention does not recognize a transponder T, control device SV reports the status "no transponder in the field" to host H.

When a transponder T reaches the response range 9 of antenna 4 and if it is recognized by measuring device M, it is provided that control device SV activates reading apparatus LV via communication connection 6. When reading apparatus LV does not know an explicit command for switching on and off its transmitter, or when the reading device even in the stand-by mode has a too high current consumption, switching on and off the voltage supply of reading apparatus LV can also be provided. Furthermore, adapter circuit AN is connected via switch 3 with the antenna terminal 8 of the reading device.

When the reading device reports the successful set-up of a communication with transponder T, it is provided to report this status to host H. In the following course, optionally, incoming commands of the host and the responses of the reading apparatus LV can be passed on between host and reading device by the control device SV without any further processing, so that host and reading apparatus LV can undisturbedly communicate with each other (transparent mode of control device SV). It is merely provided, that control device SV monitors the communication between host H and reading apparatus LV, in order to be able to recognize the status "transponder has left response field".

When the transponder has left the response field, according to the invention it is provided that the reading apparatus LV is deactivated by a command of the control device SV or, optionally, by switching off the voltage supply. Thereafter, control device SV again takes over the communication with host H and finally switches the adapter circuit AN with the help of switch 3 to measuring device M, so as to again start the measuring process.

In a variant of the two embodiments shown in FIGS. 2 and 3 it is provided, that after the detection of a transponder the reading apparatus LV in each case is activated for a precisely preset time by control device SV. For this purpose the control device or the reading apparatus LV itself has an appropriate timer module. After the expiration of the time preset at the timer module, switch 3 is again connected to the measuring apparatus MV; at the same time the energy supply of the reading apparatus LV is interrupted. The variant is in particular suitable for arrangements which do not have a suitable stand-by or self switching-off mechanism or in which such a mode cannot be set from outside.

The invention claimed is:

1. A switching device for generating a switch signal to be activated with the help of a transponder, comprising:
    an antenna adapted, with the help of an adapter circuit, to a given resistance, and
    a measuring bridge comprising two voltage dividers connected in parallel, wherein the resistance acts in one of the voltage dividers and the measuring bridge generates the switch signal when the resistance changes.

2. The switching device according to claim 1, wherein each voltage divider has two resistors connected in series.

3. The switching device according to claim 1, wherein the measuring bridge is a Wheatstone measuring bridge.

4. The switching device according to claim 1, wherein the measuring bridge is arranged to generate the switch signal when a voltage between the two voltage dividers connected in parallel exceeds a given threshold.

5. The switching device according to claim 1, wherein the adapter circuit is arranged to resonate the antenna at a frequency suitable for communication with other devices.

6. The switching device according to claim 1, wherein the adapter circuit is arranged to adapt the antenna to a given resistance.

7. The switching device according to claim 1, wherein the adapter circuit is connected with the measuring bridge via a coaxial cable connection.

8. The switching device according to claim 1, wherein the antenna is an antenna coil.

9. The switching device according to claim 1, including a high-frequency oscillator, which is arranged so that it generates an alternating voltage with a predetermined frequency and feeds it into the measuring bridge.

10. The switching device according to claim 1, including a measuring amplifier, which is disposed between the two voltage dividers.

11. The switching device according to claim 1, wherein the switching device is arranged for use in a transponder reading device for communication with a transponder.

12. A reading device for communicating with a transponder of an external device, comprising a reading apparatus, which carries out the communication with the transponder, a switching device according to claim 1, and a control device arranged to control a switch on the basis of a switch signal of the switching device, the switch connecting the adapter circuit with the reading device.

13. The reading device according to claim 12, wherein the control device is arranged to control the switch both dependent on the switch signal of the switching device and dependent on a signal of the reading apparatus.

14. The reading device according to claim 12, wherein, the reading apparatus is arranged to start the communication with the transponder of the external device when the control device receives the switch signal from the switching device.

15. A method for the communication between a reading device and a transponder of an external device, wherein the reading device comprises:

a reading apparatus for the communication with the transponder, and a control device, comprising using a switching device to generate a switch signal for the control device when the transponder reaches a detection range of the antenna of the switching device, and the control device on the basis of the switch signal to activate the communication with the transponder of the external device, and using as the switching device the switching device according to claim 1.

16. The method according to claim 15, including connecting the measuring bridge of the switching device with the adapter circuit of the switching device via a switch when no communication of the reading apparatus with a transponder takes place.

17. The method according to claim 15, including connecting the reading apparatus with the adapter circuit of the switching device via a switch, when the switching device supplies a switch signal.

* * * * *